(12) United States Patent
Lo et al.

(10) Patent No.: US 9,336,855 B2
(45) Date of Patent: May 10, 2016

(54) METHODS AND SYSTEMS FOR SMART REFRESH OF DYNAMIC RANDOM ACCESS MEMORY

(71) Applicant: QUALCOMM Incorporated, San Diego, CA (US)

(72) Inventors: Haw-Jing Lo, San Diego, CA (US); Dexter Chun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 183 days.

(21) Appl. No.: 13/893,670

(22) Filed: May 14, 2013

(65) Prior Publication Data

US 2014/0344513 A1 Nov. 20, 2014

(51) Int. Cl.
*G11C 7/04* (2006.01)
*G11C 11/406* (2006.01)
*G11C 11/4072* (2006.01)

(52) U.S. Cl.
CPC ............ *G11C 11/40622* (2013.01); *G11C 7/04* (2013.01); *G11C 11/4072* (2013.01); *G11C 11/40603* (2013.01); *G11C 11/40611* (2013.01); *G11C 11/40626* (2013.01)

(58) Field of Classification Search
CPC ............ G11C 11/406; G11C 11/40615; G06F 13/1636
USPC .......................................................... 711/106
See application file for complete search history.

(56) References Cited

U.S. PATENT DOCUMENTS

| 4,006,468 | A | * | 2/1977 | Webster | ............... | G11C 11/406 |
| | | | | | | 365/222 |
| 5,469,559 | A | * | 11/1995 | Parks | ...................... | G06F 12/06 |
| | | | | | | 365/222 |
| 5,890,198 | A | * | 3/1999 | Pawlowski | .................... | 711/106 |
| 6,094,705 | A | * | 7/2000 | Song | ............................ | 711/106 |
| 6,230,235 | B1 | * | 5/2001 | Lu et al. | ........................ | 711/106 |
| 6,385,113 | B1 | * | 5/2002 | Longwell | ............. | G11C 7/1045 |
| | | | | | | 365/149 |
| 6,594,189 | B2 | | 7/2003 | Shimoyama | | |

(Continued)

FOREIGN PATENT DOCUMENTS

JP H09282873 A 10/1997

OTHER PUBLICATIONS

International Search Report and Written Opinion—PCT/US2014/037525—ISA/EPO—Sep. 3, 2014.

(Continued)

*Primary Examiner* — Jared Rutz
*Assistant Examiner* — Khoa D Doan
(74) *Attorney, Agent, or Firm* — The Marbury Law Group, PLLC

(57) ABSTRACT

Methods and devices for refreshing a dynamic memory device, (e.g., DRAM) to eliminate unnecessary page refresh operations. A value in a lookup table for the page may indicate whether valid data including all zeros is present in the page. When the page includes valid data of all zeros, the lookup table value may be set so that refresh, memory read, write and clear accesses of the page may be inhibited and a valid value may be returned. A second lookup table may contain a second value indicating whether a page has been accessed by a page read or write during the page refresh interval. A page refresh, by issuing an ACT-PRE command pair, and a page address may be performed according to the page refresh interval when the second value indicates that page access has not occurred.

48 Claims, 14 Drawing Sheets

(56) References Cited

U.S. PATENT DOCUMENTS

| | | | |
|---|---|---|---|
| 6,650,586 B1* | 11/2003 | Fanning | 365/222 |
| 7,342,841 B2* | 3/2008 | Jain | G11C 11/406 |
| | | | 365/222 |
| 7,711,897 B1* | 5/2010 | Chatterjee | G06F 3/0605 |
| | | | 711/112 |
| 7,821,861 B2* | 10/2010 | Lin | G11C 11/406 |
| | | | 365/189.12 |
| 8,559,258 B1* | 10/2013 | Stephens, Jr. | 365/222 |
| 2003/0231540 A1* | 12/2003 | Lazar | G11C 11/406 |
| | | | 365/222 |
| 2004/0107324 A1* | 6/2004 | Nystuen | G06F 13/1626 |
| | | | 711/158 |
| 2005/0074051 A1 | 4/2005 | Won et al. | |
| 2007/0033339 A1* | 2/2007 | Best | G11C 11/406 |
| | | | 711/106 |
| 2009/0161467 A1* | 6/2009 | Lin | G11C 11/40603 |
| | | | 365/222 |
| 2009/0172270 A1* | 7/2009 | Kardach | G06F 12/0223 |
| | | | 711/105 |
| 2012/0317388 A1* | 12/2012 | Driever | G06F 12/0646 |
| | | | 711/170 |

OTHER PUBLICATIONS

Taiwan Search Report—TW103116992—TIPO—Aug. 5, 2015.

* cited by examiner

METHODS AND SYSTEMS FOR SMART REFRESH OF DYNAMIC RANDOM ACCESS MEMORY

BACKGROUND

A Dynamic Random Access Memory (DRAM) is a memory device constructed of a collection of cells each made up of a transistor and a capacitor. DRAM cells are arranged in a matrix with multiple rows and columns of cells. Each row of cells is referred to as a "page" and the matrix of DRAM cells is referred to as a "bank." Multiple banks are combined to form a DRAM device. DRAM operates to retain information in each cell by storing a charge in the capacitor and using the transistor as an access switch. The capacitor may either be charged or discharged corresponding to a stored value of, for example, 1 or 0. A write to a location of either a "0" or a "1" may be considered a "refresh" in that the value will be maintained for the duration of the refresh cycle in which the value was written. For example, if a page is written to, the page may be considered refreshed for the duration of the refresh cycle.

Over time, the capacitor eventually "leaks", or loses its charge, requiring the DRAM to be periodically refreshed. A value for the capacitor drain time, that is, the time it takes for the capacitor to fully lose a charge, is around 64 ms depending on systematic factors such as temperature and other factors. Sometime before the discharge time elapses, a refresh should occur to sustain the charge state of charged cells.

Refresh may be accomplished by performing a refresh command (REF) provided by the DRAM manufacturer and may be periodically issued by, for example, the memory controller on a System-on-Chip (SoC) within which the DRAM is embedded or to which the DRAM is coupled. The REF command does not require the address of the page. Instead, when the REF command is issued, the address for refresh is computed internally within the DRAM based on the operation of internal logic. During a typical refresh associated with the REF command, a single page in the entire DRAM is refreshed (per bank refresh), or one page in every bank in the DRAM is refreshed (all bank refresh). During the REF refresh operation, or any refresh operation, the bank containing the page undergoing refresh is unavailable for access. For an all bank refresh, the entire DRAM becomes unavailable.

Unavailability of the DRAM during refresh negatively impacts DRAM access performance. Rather than iteratively refreshing all the pages at the same time, which would result in a refresh of the entire DRAM and complete unavailability for access, the refresh command is applied over the 64 ms period to different sections of the DRAM. Accordingly, for a refresh of an entire DRAM on a page by page basis, each page is refreshed within the 64 ms and only one page, or one page in all banks, is unavailable at one time. By spreading out the refresh command in the above described manner, more refresh commands are issued. The page refresh interval becomes 3.9 us or 7.8 us, depending on the density and architecture of the memory. For example for a DRAM with 8K (8192, or $2^{13}$) pages, the page refresh interval may be calculated as: $t_{REFI}$=64 ms/8192=7.8 us. A conventional DRAM has internal logic that tracks the page(s) that are to be refreshed next. Internal logic in the device may be configured to iterate through all of the pages in a sequential manner. The memory controller may issue the REF command every $t_{REFI}$ as defined by the DRAM manufacturer. To reduce the impact of REF on DRAM performance, DRAM vendors may internally refresh two or more pages at a time. The conventional REF command provided by DRAM vendors is not configured to accept an address associated with a page location or multiple addresses for multiple locations. Therefore, a system designer has little flexibility to control aspects of the DRAM refresh operation. As a result, potential efficiency gains that would be achievable if DRAM refresh was controllable are not able to be realized.

SUMMARY

Various aspects provide methods and devices for reading, writing and refreshing a dynamic memory device (e.g., DRAM) that tracks the memory status of pages in a small table that may be used to eliminate some read, clear (i.e., write zeros) and refresh operations when the page includes no data or all zeros.

An aspect method may include setting a first value in a first lookup table associated with a page of memory cells in the dynamic memory device to indicate when the page includes valid data of all zeros, and controlling page refreshes performed according to a page refresh interval so as to inhibit refresh of pages of memory cells whose associated first value in the first lookup table indicates that the page includes valid data of all zeros. In a further aspect, access to the page of memory cells associated with a read request may be inhibited when a first value in the lookup table indicates that the page of memory cells includes valid data of all zeros, and one or more zeros may be returned in response to the read request without accessing the page. In a further aspect, access to a page of memory cells associated with a write request may be inhibited when a first value in the lookup table indicates that the page of memory cells includes valid data of all zeros and the write value includes one or more zeros to be written to the page, in which case an indication of a successful write operation may be returned in response to the write request without conducting the write operation. In a further aspect, access to the page associated with a clear request may be inhibited when a first value in the lookup table indicates that the page of memory cells includes valid data of all zeros, in which case an indication of a successful clear operation may be returned in response to the clear request without conducting the clear operation.

In a further aspect, a second value for the page of memory cells may be set in a second lookup table to indicate that an access has occurred on the page, and the performance of page refreshes according to the page refresh interval may be controlled so as to inhibit refreshing pages of memory cells whose associated second value indicates that a read or write access has occurred and whose associated first value in the first lookup table indicates that the page includes valid data at least some of which is not zero. In a further aspect, the first lookup table may be cleared at a startup of a system containing the memory device, and the second lookup table may be cleared at an end of the refresh interval. In a further aspect, controlling page refreshes performed according to the page refresh interval may include issuing an activate (ACT)–precharge (PRE) command pair including a page address for pages of memory cells whose associated first value indicates that valid data that is not all zeros is present in the page of memory cells and whose associated second value indicates that a read or write access has not occurred. Alternatively, or in addition, the page refresh may be controlled such that a refresh (REF) command may be issued for the memory device when a number of pages in the memory device to be refreshed exceeds a threshold.

In another aspect, a number of pages of the dynamic memory device may be determined that contain valid data that is not all zeros using values in the first lookup table, and the page refresh interval may be adjusted based on a temperature of the dynamic memory device and the number of pages of the dynamic memory device that contain valid data that is not all zeros. In a further aspect, a number of pages of the dynamic memory device to be refreshed may be determined using values in the second lookup table, and the page refresh interval may be adjusted based on a temperature of the dynamic memory device, the number of pages of the dynamic memory device that contain valid data that is not all zeros, and the number of pages of the dynamic memory device to be refreshed. In a further aspect, a command queue associated with the dynamic memory device may be monitored to determine when an activate (ACT) command associated with the page is present in the command queue, and page refreshes performed according to the page refresh interval may be controlled so as to inhibit the refresh of pages of memory cells (i) with an active command present in the command queue (ii) whose associated second value indicates that a read or write access has not occurred on the page, and (iii) whose associated first value indicates that the page includes valid data at least some of which is not zero.

Further aspects include a computing device including a memory and a processor coupled to the memory that is configured with processor-executable instructions to perform operations of the methods described above. Further aspects include a computing device including a memory and means for performing functions of the methods described above.

Further aspects include non-transitory processor-readable or computer-readable storage media having stored thereon processor-executable instructions configured to cause a processor to perform operations of the methods described above.

BRIEF DESCRIPTION OF THE DRAWINGS

The accompanying drawings, which are incorporated herein and constitute part of this specification, illustrate exemplary aspects of the invention, and together with the general description given above and the detailed description given below, serve to explain the features of the invention.

DETAILED DESCRIPTION

Figure 1A:
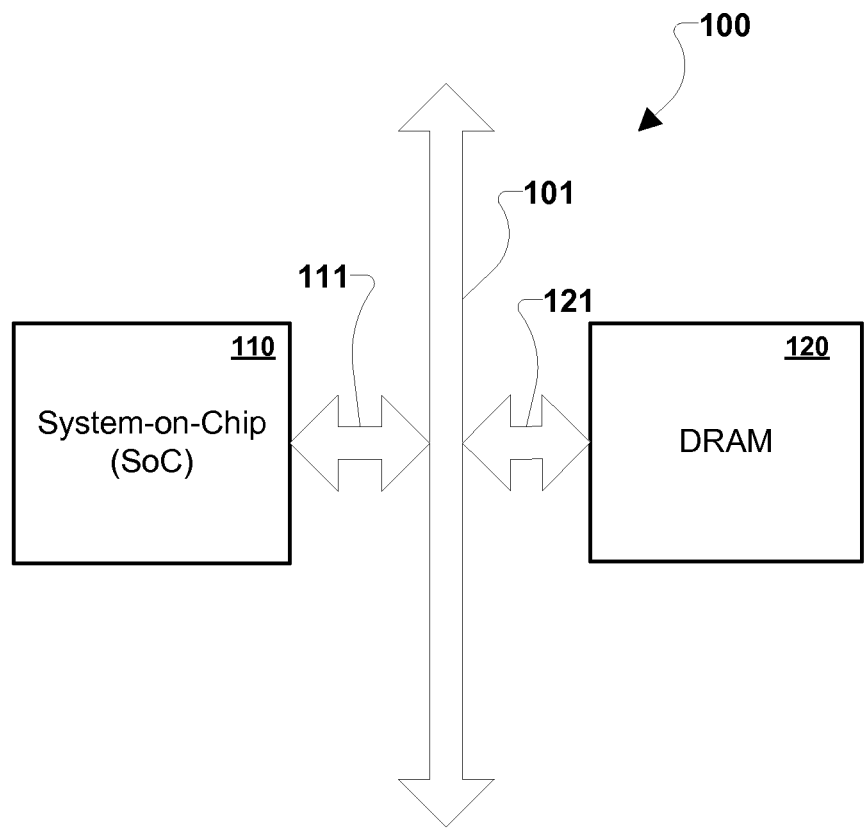
FIG. 1A is a block diagram illustrating an exemplary system with a Dynamic Random Access Memory (DRAM) module in various aspects.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The word "exemplary" is used herein to mean "serving as an example, instance, or illustration." Any implementation described herein as "exemplary" is not necessarily to be construed as preferred or advantageous over other implementations.

The term "computing device" is used herein to refer to any one or all of cellular telephones, smart phones, personal or mobile multi-media players, personal data assistants (PDA's), laptop computers, desktop computers, tablet computers, smart books, palm-top computers, wireless electronic mail receivers, multimedia Internet enabled cellular telephones, televisions, smart TVs, smart TV set-top buddy boxes, integrated smart TVs, streaming media players, smart cable boxes, set-top boxes, digital video recorders (DVR), digital media players, and similar personal electronic devices which include a programmable processor and memory.

The various aspects described herein address and overcome the drawbacks of present DRAM refresh methods in that a memory controller, controller, processor, or other control device or logic, such as may be part of an exemplary SoC in which a DRAM in accordance with aspects may be implemented, may take control of DRAM refreshes and other operations associated with a DRAM. The various aspects may enable bypassing or inhibiting redundant and unnecessary DRAM refreshes as well as and other features that may improve performance and reduce power consumption of a memory device such as a DRAM device. An SoC, memory, system controller, or control device may be provided with information related to how the DRAM was accessed, the pages that were refreshed and the pages that contain valid data, an information associated with when a particular page needs to be refreshed. By integrating logic associated with various aspects into a DRAM memory controller, performance may be further enhanced, for example, by staggering or parallelizing the refresh command. Logic configured to handle DRAM refreshes may be sophisticated and may intelligently handle refreshes, and other tasks such as memory access, based on various information, control procedures or logic, providing added advantages over conventional DRAM refresh approaches that rely on refreshing an entire DRAM device. In various aspects, a DRAM may be refreshed sequentially on a page by page basis as needed, or refreshed selectively by proceeding in accordance with an exemplary lookup table that may provide information so that pages may be refreshed (or not) based on recent accesses and information content, and additional memory control may be implemented. Further, the refresh may be performed with a sequence of DRAM commands, namely activate (ACT) followed by precharge (PRE). Both the ACT and PRE commands require the address of the page being refreshed. The ACT and PRE commands can be combined with a page address to selectively refresh those pages that have not been accessed during the refresh interval.

Figure 1B:
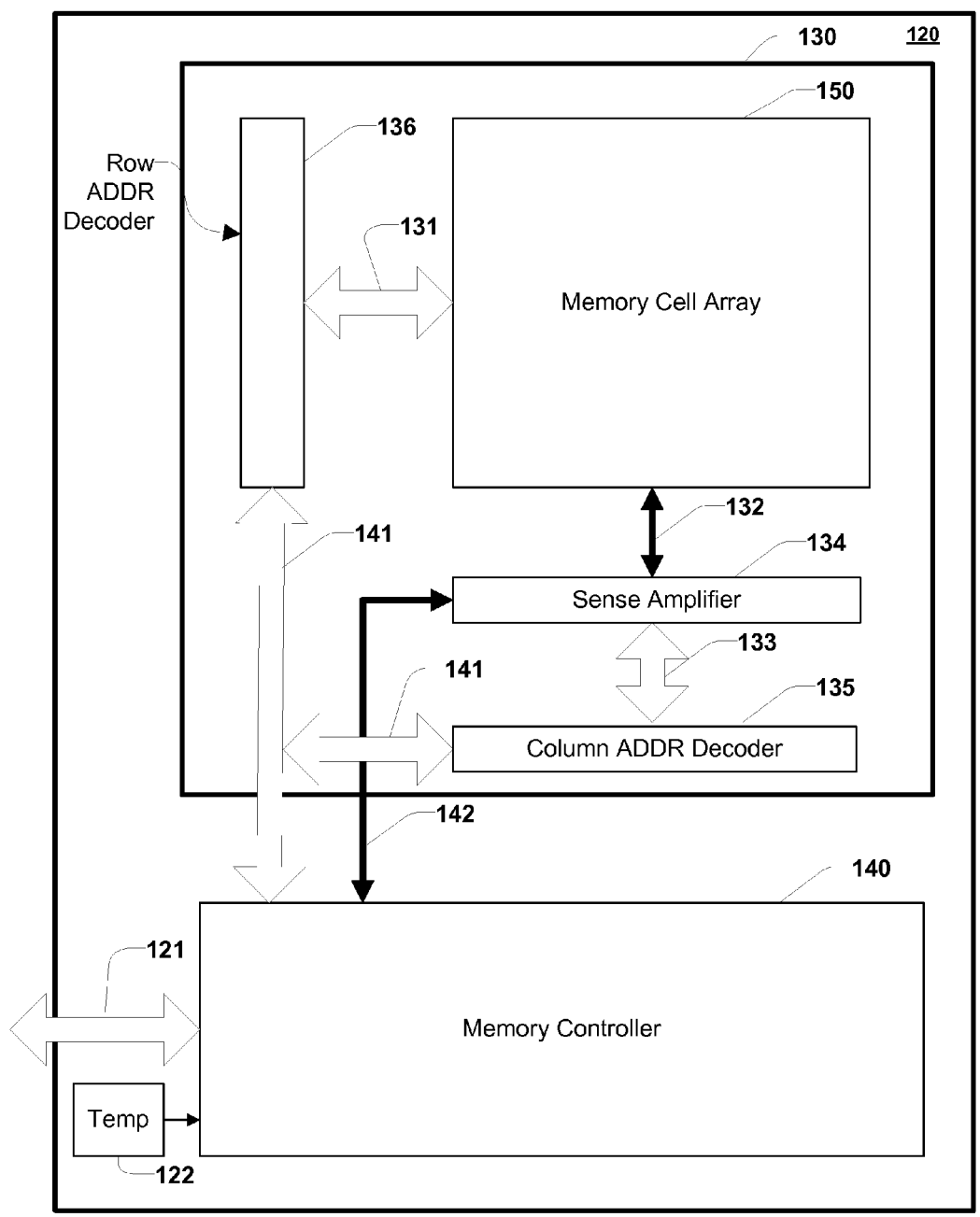
FIG. 1B is a diagram illustrating exemplary portions of a DRAM module in various aspects.
Figure 1C:
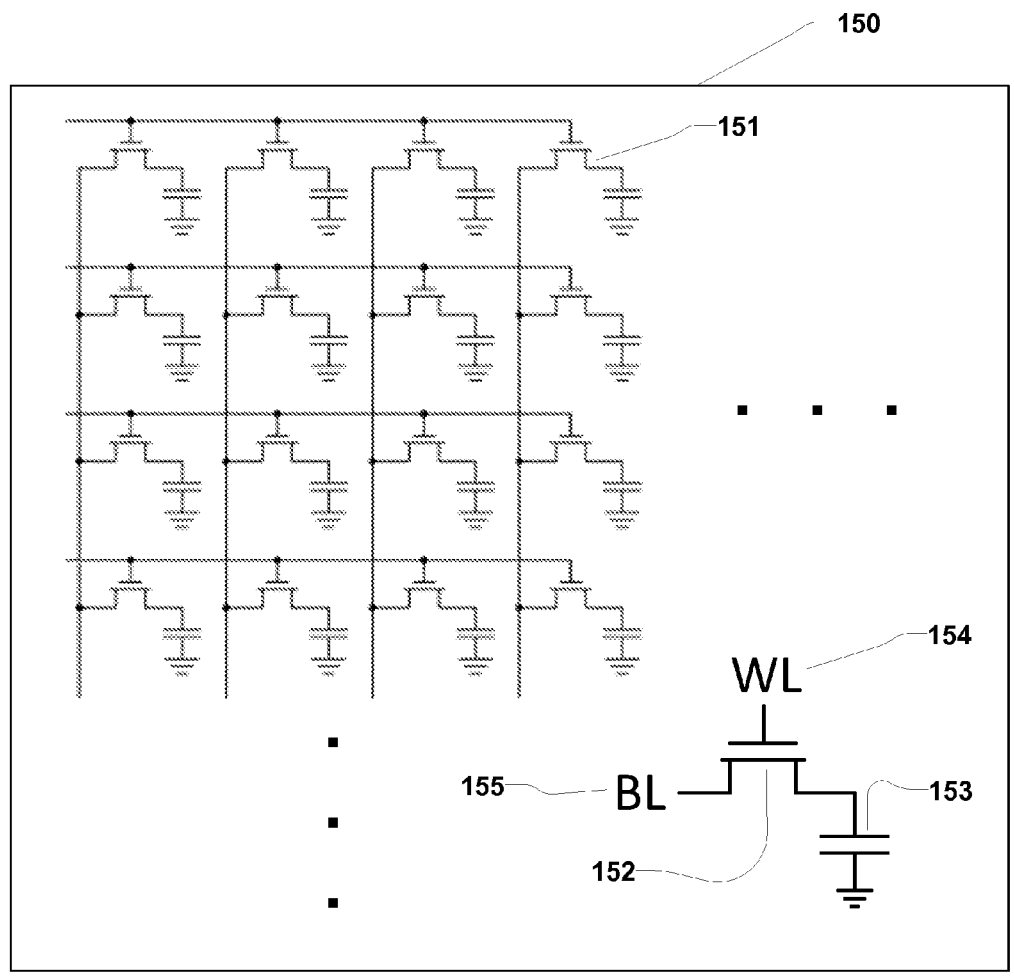
FIG. 1C is a diagram illustrating exemplary cells of a DRAM module in various aspects.

A series of diagrams illustrating various aspects are shown in FIGS. 1A-1C. In FIG. 1A, a simplified block diagram of a typical computing system 100 or portion of a system, includes a SoC 110 and a dynamic random access memory device, such as memory 120, which may be coupled to a bus 101 through bus connections 111 and 112 respectively. As shown in FIG. 1B, a memory 120 may be provided with a typical DRAM memory 130, a memory controller 140 and a memory cell array 150. The DRAM memory 130 may be further provided with, for example, a sense amplifier 134, a column address decoder 135, and a row address decoder 136. During operations "rows" or pages may be selected for access by providing the appropriate address to the row address decoder 136, which may then gain access to the memory cell array 150 through a bus connection 131. To access a specific cell within a row, a column may be selected for access by providing the appropriate column address to the column address decoder 135 which may be coupled to the sense amplifier 134 through a bus connection 133. The sense amplifier 134 may in turn be coupled to the memory cell array 150 through a bus connection 132. When reading the memory contents, the sense amplifier 134 may provide a signal indicating the charge value of the selected cell and, hence, the data value stored in the cell. While the above configuration and attendant description are illustrative of basic aspects of a typical DRAM device, other configurations are possible. Further, the various aspects may be implementing in a variety of memory configurations.

The memory controller 140 may operate independently with embedded processing capability, such as control logic or other control circuits or modules, or may be a standard controller that is coupled to a processor or other logic (not shown) that may be configured to control aspects of memory refresh of the memory cell array 150 and may be provided with or have access to a memory for storage of various information. The memory controller 140 may be coupled to the bus 101 through a bus connection 121 and may additionally provide bidirectional data and control signals to and from the memory 130 and components thereof, over the bus lines 141 and 142. A temperature of the system or device may be provided by a temperature sensor 122, or the temperature may be provided as data over the bus connection 121. The memory 120 may, alternatively or in addition to the control provided by the memory controller 140, be controlled by a system processor (not shown) over the bus connection 121, either by a processor embedded in SoC 110 or otherwise coupled to the bus connection 121 or the bus 101. For ease of description, the term "bus" as referred to herein may mean a data bus, control bus, data line, control line, signal line or other line, which may be uni- or bi-directional and may be under the additional control of bus interface devices as would be expected. The lines that may comprise an exemplary bus may also be special purpose such as a sense or power line, analog signal line, clock line, or other high speed or low speed data lines, or other lines. While a memory controller is described herein, in alternative aspects, the memory device itself may be modified to incorporate control logic within elements, add additional logic or other circuits or modules, such that the aspects described herein may be implemented as a memory device configured to accept page addresses in connection with refresh commands and to inhibit refresh or access to pages as further described herein.

The memory cell array 150, as shown in FIG. 1C, may be made up of an array of memory cells 151 each including a transistor 152 and a capacitor 153 that holds a voltage level that corresponds to the state of data storage of the cell. For example, a low voltage charge on the capacitor 153 may correspond to a "0" while a relatively high voltage charge may correspond to a "1." To access the state of charge of the capacitor 153, a word line (WL) 154 and bit line (BL) 155 may be activated for a particular cell. For example, by addressing the appropriate row to activate the WL 154, the gate of the transistor 152 may be activated and, by addressing the appropriate column and, thus, the corresponding one of the BL 155, a charge on the capacitor 153, representing the data value stored at the cell location, may be detected for a read operation. For a write operation, addressing the WL 154 and the BL 155 may allow a charge to be applied to the cell. However, as noted above, the charge on the capacitor 153 may diminish over a relatively short period of time, and thus may require periodic refresh within the page refresh interval appropriate for the particular memory device and conditions. A typical page refresh interval may be from around 45 ms to 65 ms, but may be more or less depending on the device and other factors such as temperature and process variations. Since different devices under different conditions may have different page refresh intervals, information regarding a present temperature, device type, and device type characteristics may be determined and stored so that adjustments to the page refresh interval may be made during operation.

Further, the number of pages to be refreshed may be factored into the refresh interval adjustment. As the refresh interval is shortened to compensate for temperature increases, more power is consumed by the memory as more refreshes are conducted per minute. Therefore, power efficiency of the memory can be increase by maintaining the refresh interval to be as long as practicable while refreshing all memory pages containing data. Temperature-based refresh calculations must account for both the time interval at which a memory cell must be refreshed and for the time required to refresh all pages in the memory. By factoring the number of pages containing some non-zero data into the temperature-based adjustment of the refresh interval, unnecessary lengthening of the refresh interval may be avoided since only the non-zero pages require refreshing. For example, if the number of non-zero pages is relatively small, the amount of time required to refresh all non-zero pages may be short enough that a full memory refresh can be accomplished within the single cell refresh time without changing the memory refresh rate. The temperature and number of pages requiring refresh may be monitored during the operation of the device and adjustments may be made dynamically as the factors change.

Figure 2A:
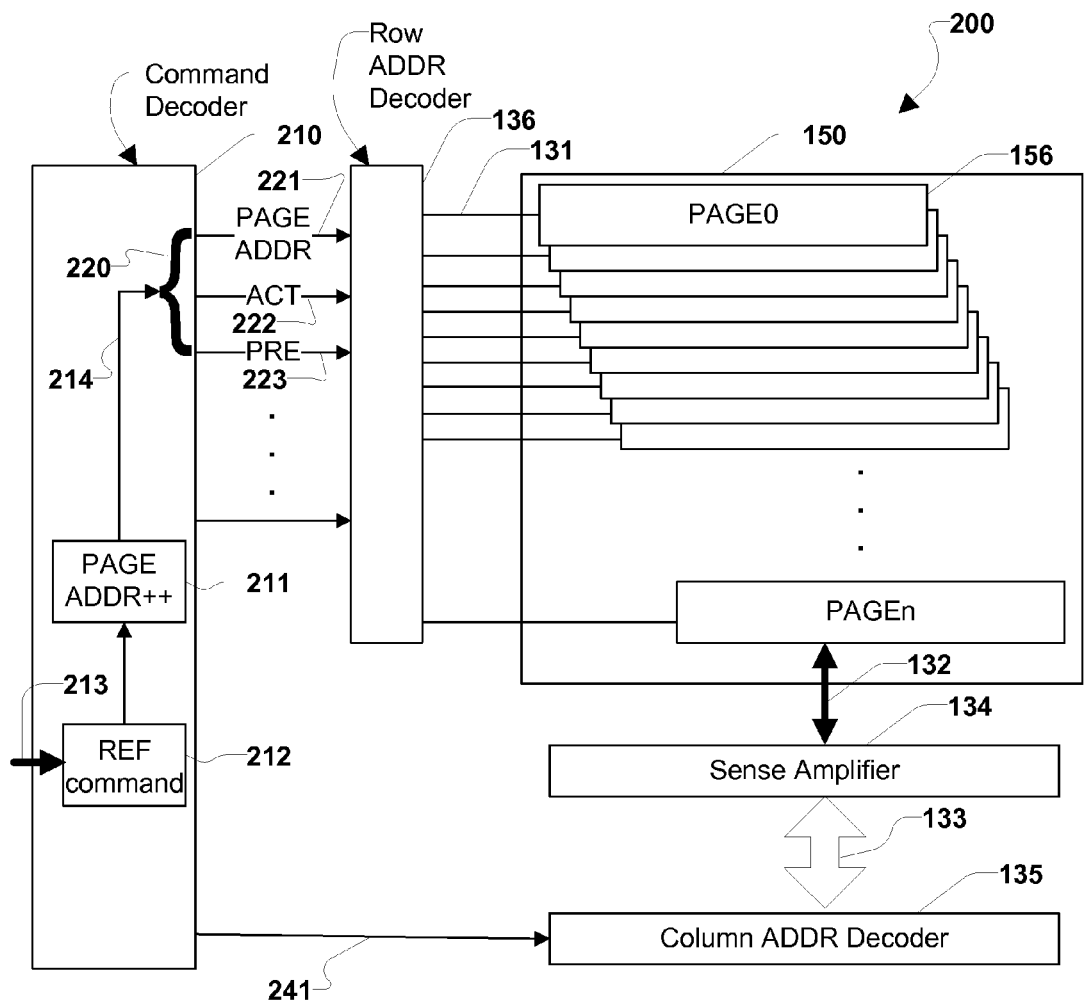
FIG. 2A is a diagram illustrating an exemplary command decoder and other portions of a DRAM module in various aspects.

In order to conduct operations on a memory module, such as memory cell array 150, a series of commands may be used as in exemplary scenario 200 illustrated in FIG. 2A. A command decoder 210 may be coupled to the row address decoder 136 and to a bus through the bus connection 213. The command decoder 210 may be part of the memory controller 140 or may be otherwise embodied within a device, DRAM device, or other memory device, such as memory 120. A refresh command, such as a REF command 212 may be received over the bus connection 213 to refresh the DRAM. The REF command may cause a page address to be incremented in block 211. A group of commands 220 may be generated within the command decoder 210 associated with the page address by a signal or series of signals 214 and may include the page address 221, an activate (ACT) command signal 222 and a precharge (PRE) command signal 223, which may be used in connection with the row address decoder 136 and the column address decoder 135 through connection 241, to select a page for refresh corresponding to the page address 221. The appropriate word line associated with bus connection 131 may be activated to select the page 156, and the contents of page 156 may be sensed and latched within the sense amplifier 134 using the bit line bus, such as bus connection 132, whereupon the contents may be written back to page 156 to complete the refresh operation. In various aspects, the page address, rather than being simply incremented may be selected based on the state of refresh or other factors to be described in greater detail hereinafter.

Figure 2B:
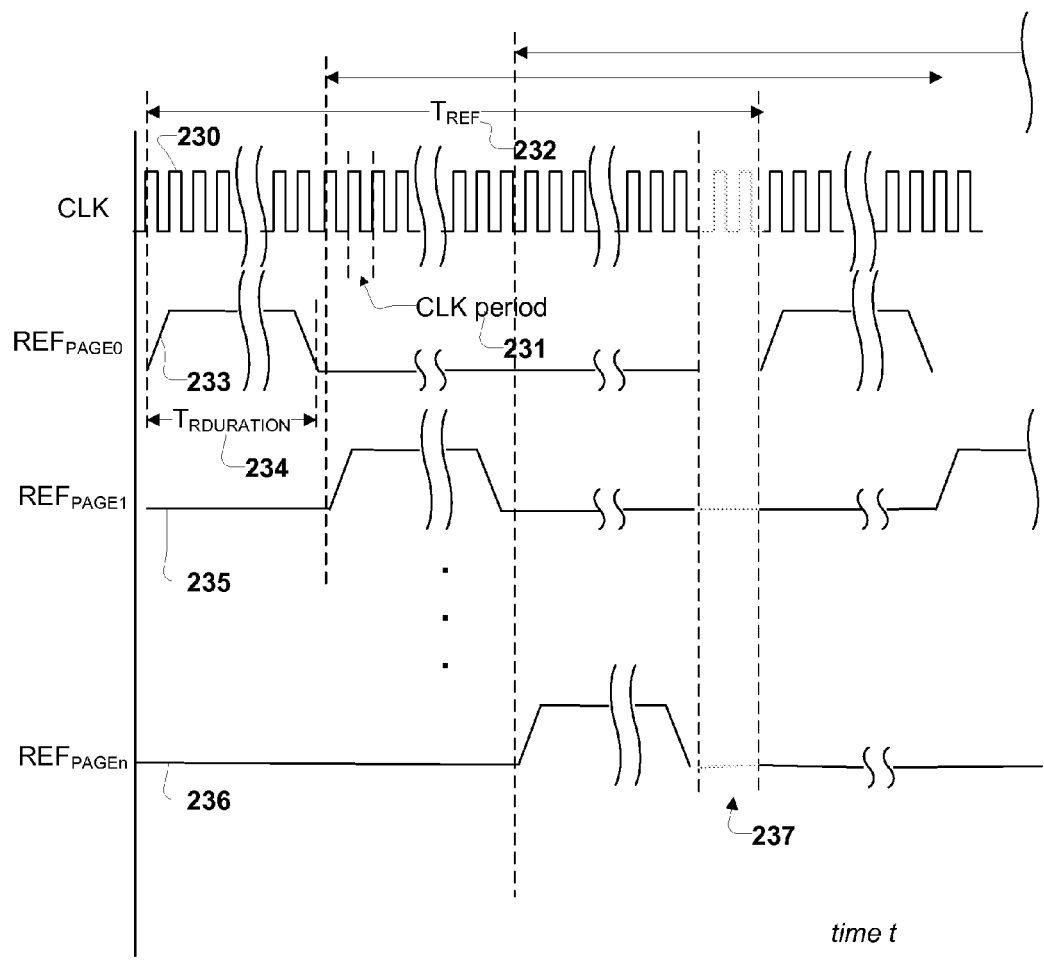
FIG. 2B is a timing diagram illustrating exemplary timing signal waveforms in one or more aspects.

Various timing signals associated with conducting the above described refresh operations are shown in FIG. 2B. A clock signal 230 may be provided, for example, at an illustrative clock rate of 1 GHz. The period 231 of the clock signal 230 in the present example, may be 1 ns. An exemplary refresh operation such as a refresh for PAGE0 of an exemplary DRAM would have a duration $T_{DURATION}$ 234 of around 100 ns during which the DRAM would be unavailable for access. In an exemplary worst-case scenario, refresh of the DRAM may be required through all of the pages in sequence such as from PAGE0 through PAGEn by applying the signals $REF_{PAGE0}$ 233, $REF_{PAGE1}$ 235 and $REF_{PAGEn}$ 236. Given a page refresh interval $T_{REF}$ 232 the interval 237 may represent an approximation of the relative time during which the DRAM would be available for access, e.g. after the page has been refreshed including other page refreshes during respective page refresh intervals. The page refresh interval $T_{REF}$ 232 may be set according to the particular characteristics of the device and other factors such as temperature and process variation, and may be started and stopped on a per page basis. The page refresh interval $T_{REF}$ 232 may also be determined from the lookup tables using the number of pages needing to be refreshed as a look up parameter. In particular, if temperature considerations would indicate that the page refresh interval $T_{REF}$ 232 for a page should be shorter, but the page need not be refreshed, then the page refresh interval $T_{REF}$ 232 for the page may be maintained. The temperature factor may change when the page finally requires a refresh and may require an adjustment to a different value. However, a general consideration regarding the refresh interval may be that the unavailability of the DRAM for relatively long periods of time may be undesirable if access to stored information may be needed immediately by the system.

Figure 3A:
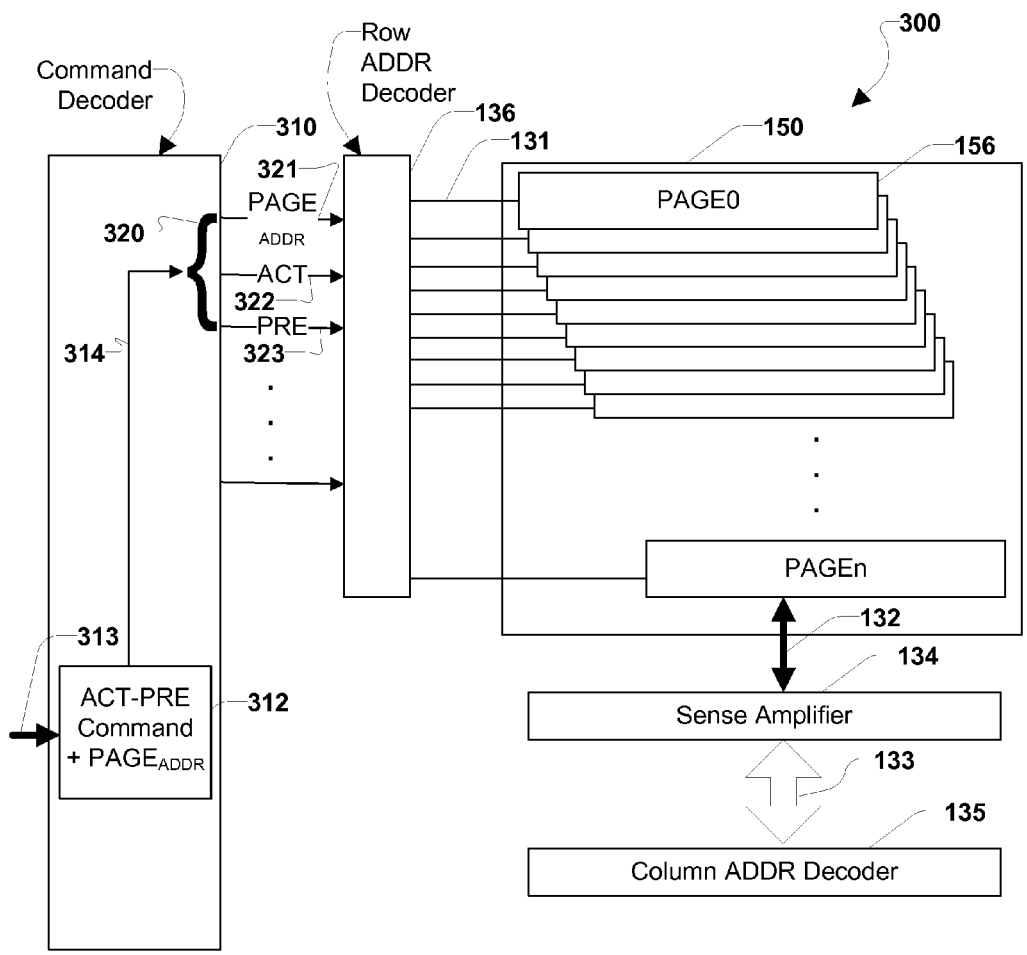
FIG. 3A is a diagram illustrating an exemplary command decoder and other portions of a DRAM module in one or more additional aspects.

In an aspect illustrated in FIG. 3A, a refresh command REF may be substituted with a selectively generated ACT-PRE command pair with a page address in exemplary scenario 300. An incoming signal or command 313, which may be generated within an exemplary memory controller, by a system processor, or other control device, may be received in block 312. Block 312, in some aspects may represent, for example a command queue for the exemplary memory controller. The incoming signal or command 313 may contain a page address for the page to be refreshed. The block 312 may generate a signal or series of signals 314 resulting in a group of commands 320. The group of commands 320 may include a page address 321, an activate (ACT) signal or command and a precharge (PRE) signal or command. The group of commands 320 may be input to the row address decoder 136 such that a selected word line of bus connection 131 and a corresponding page 156 may be individually accessed for refresh. Thus, when a particular page has been identified as requiring refresh, the above described configuration may advantageously allow only the selected page to be refreshed. For example, if a majority of pages within the memory do not require refresh, a power savings may be realized and the memory may continue to be available for access to the information contained therein. In an alternative aspect, a DRAM device may be modified to include the ability to process a refresh command that includes a page address or address range for selective or intelligent refreshing in accordance with the aspects described herein.

Figure 3B:
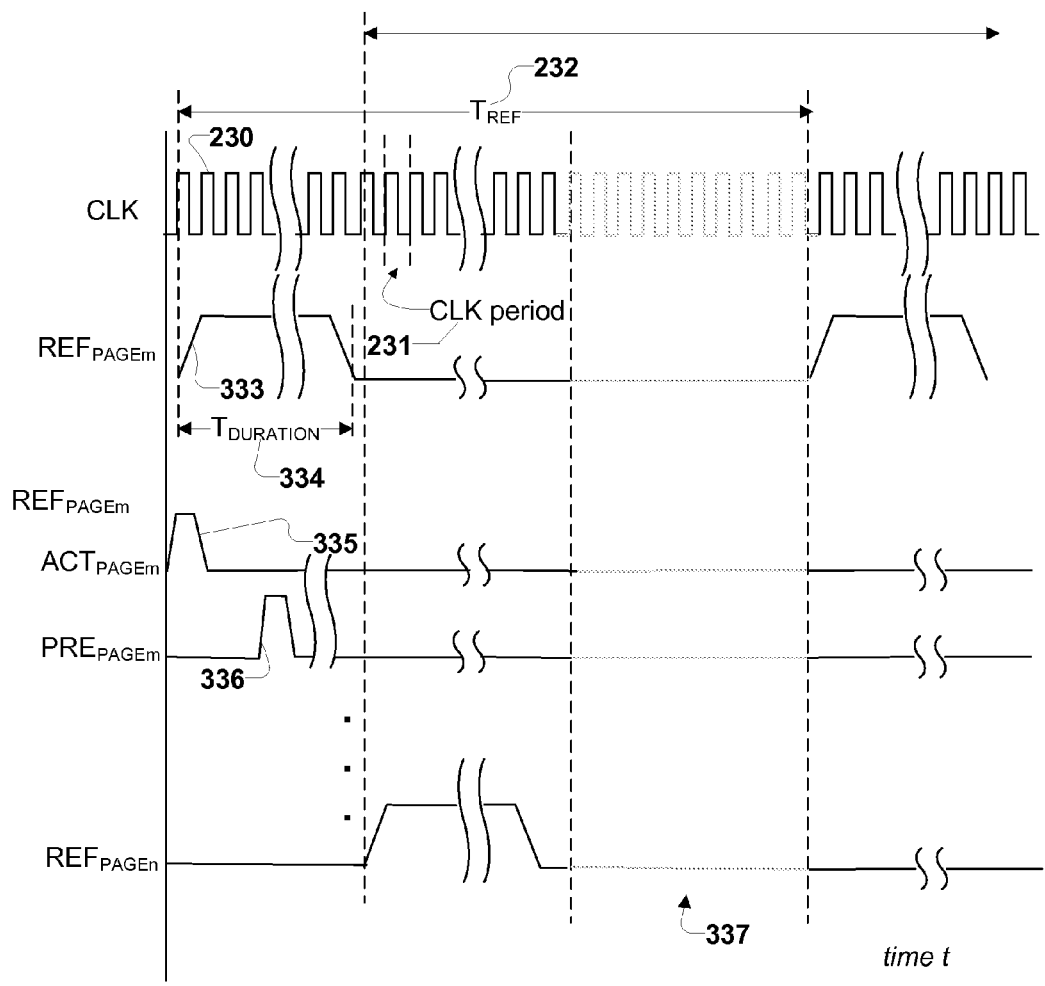
FIG. 3B is a timing diagram illustrating exemplary timing signal waveforms in one or more additional aspects.

Various timing signals associated with the modified refresh operation of FIG. 3A are illustrated in FIG. 3B. In an aspect, a modified refresh command $REF_{PAGEm}$ 333 may be issued including a page address for PAGEm indicating the specific page for which a refresh is being requested. The duration $T_{DURATION}$ 334 of the refresh command, when selectively issued, may result in fewer refresh commands being issued during a given page refresh interval based on, for example, the refresh requirement in terms of the number of pages requiring refresh as a percentage of the total number of pages. A refresh command in an aspect may include an activate signal $ACT_{PAGEm}$ 335 and a precharge signal $PRE_{PAGEm}$ 336 that may be issued along with the address of the page $PAGEm_{ADDR}$ (not shown). In this manner, control over the refresh process may be overtaken by a memory controller, processor, or other control device or logic to improve the speed and selectively of page refreshes and to improve energy efficiency. In the illustrated aspect, the interval 337 may represent the time during which the memory device may be available and may represent an increase over the availability resulting from the use of conventional methods under certain circumstances.

Figure 3C:
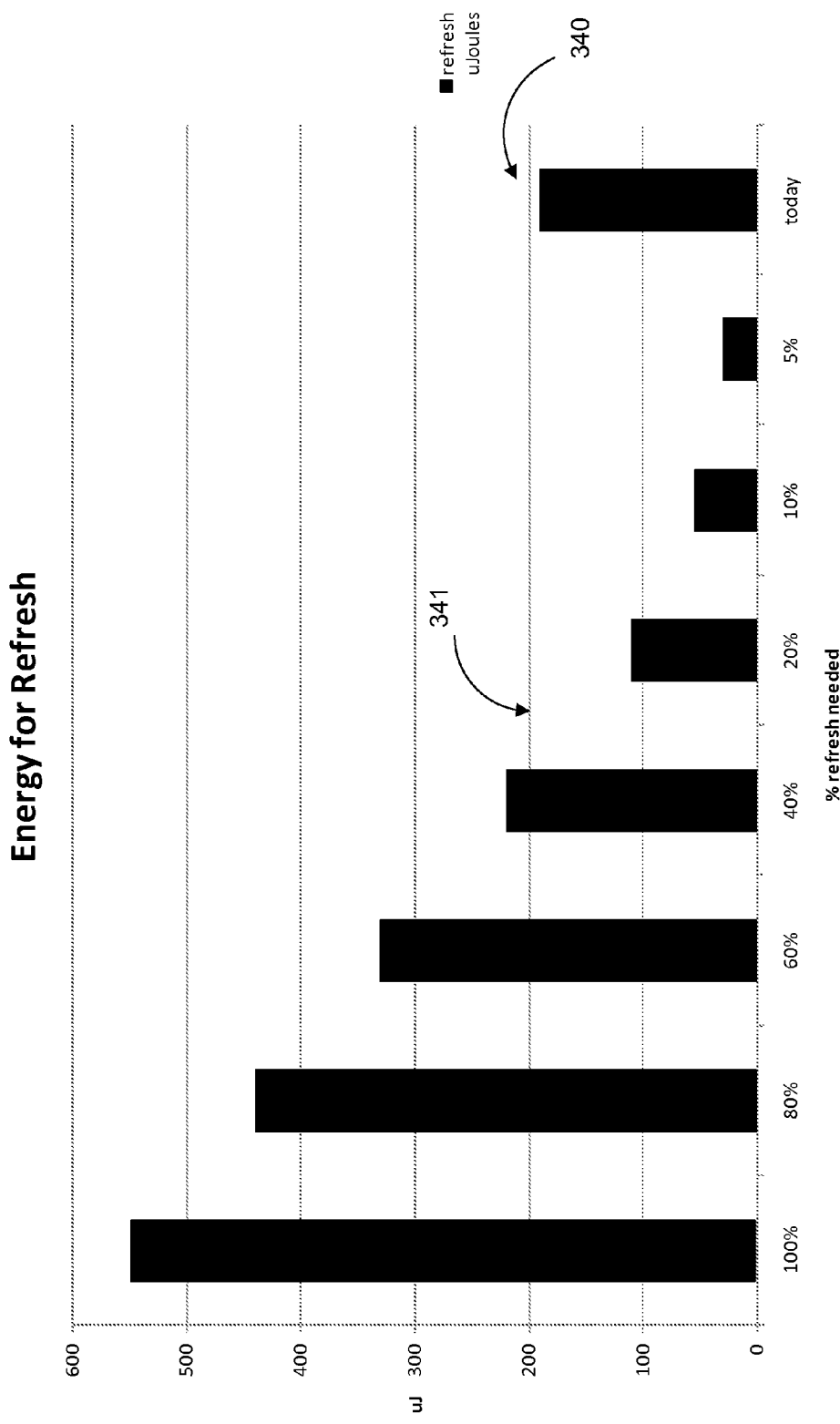
FIG. 3C is a graph illustrating exemplary energy savings associated with refresh in various aspects.
Figure 3D:
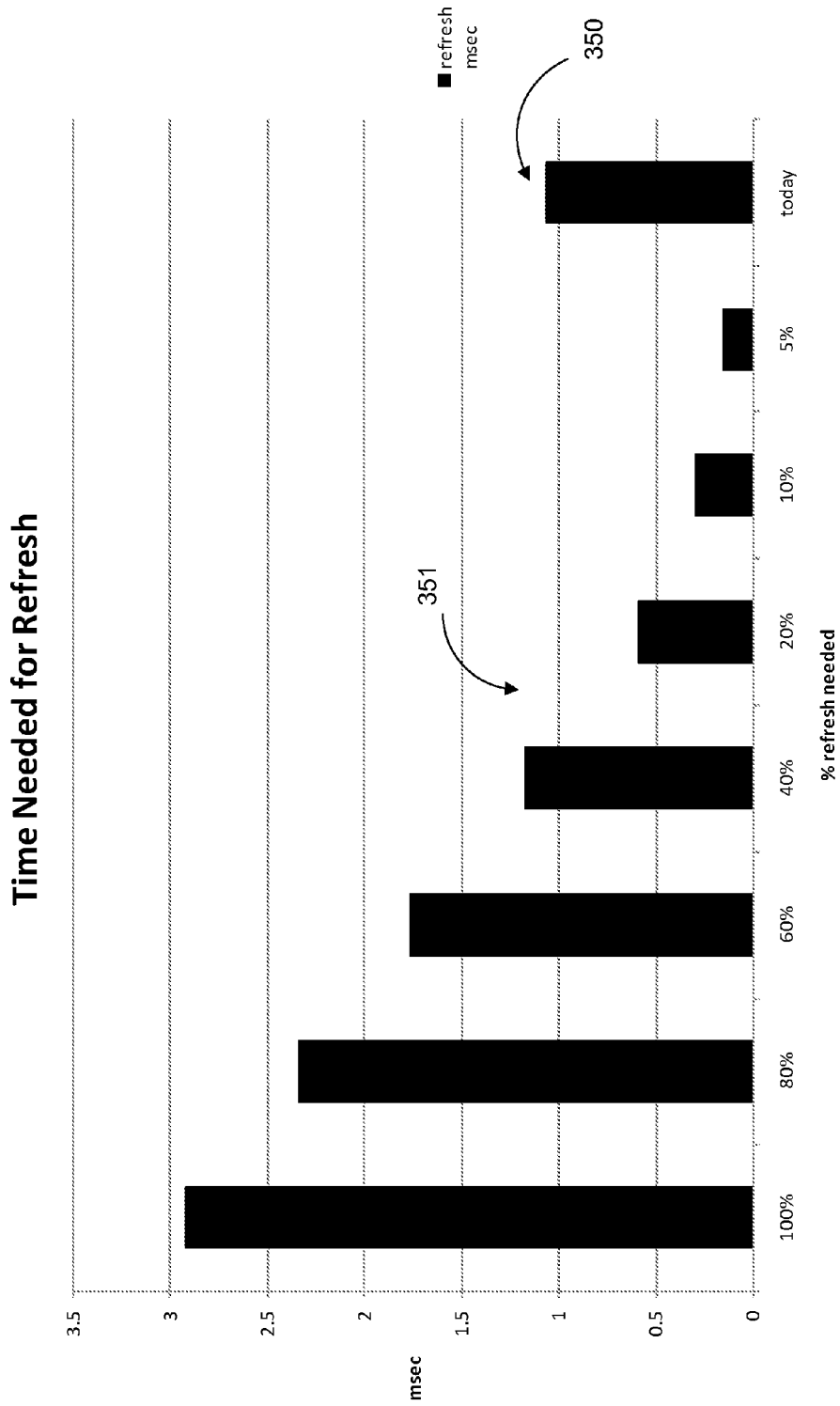
FIG. 3D is a graph illustrating exemplary time savings associated with refresh in various aspects

As shown in the graph of FIG. 3C, energy savings may be realized by implementing the various aspects, particularly for DRAMs that require relatively little refresh as a percentage of DRAM size. A conventional DRAM refresh approach may require an energy level 340 slightly less than 200 micro joules for a DRAM refresh regardless of the refresh requirement percentage. Up to something slightly under a 40% refresh requirement 341, for example, significant benefits in terms of energy savings may be realized in various aspects. For example, for a 20% refresh requirement percentage, the energy required in various aspects will be roughly half of the energy required for conventional refresh approaches. The significance of energy savings may be to prolong battery life and to prevent unnecessary battery drain during other critical operations such as operation of a radio transceiver on a mobile telecommunication device. As further shown in the graph of FIG. 3D, time savings may also be realized in various aspects. A conventional DRAM refresh approach requires a time 350 of around 1 ms for a DRAM refresh regardless of the refresh requirement percentage. Up to, for example, something slightly under a 40% refresh requirement 351, significant benefits in terms of time savings may be realized in various aspects. For example, again, for a 20% refresh requirement percentage, the time required in various aspects will be roughly half of the time required for conventional refresh approaches. The significance of time savings may be to reduce the amount of time during which the DRAM is unavailable for access and may also have a collateral effect on energy savings based on the reduced amount of time during which the DRAM is being accessed. For conditions under which a significant percentage of the DRAM requires refresh, such as over between around 20% to around 40% or more, an intelligent memory controller in aspects, may decide to use the conventional refresh mechanisms, such as using a conventional REF command for the DRAM instead of the ACT+PRE command pair plus page address. Thus, the memory controller may determine a threshold, such as the number or percentage of pages of the DRAM requiring refresh, and base the application of intelligent refresh on whether the number or percentage exceeds the threshold. The exact point at which a decision may be made to switch from intelligent refresh to conventional refresh methods may be pre-configured, or may be based on information collected or on calculations performed during operation. In an alternative aspect, a command queue associated with an exemplary memory controller may be examined to determine whether any ACT commands are pending in the command queue for a particular page and are likely to be executed during the refresh interval. If such commands are found, then a decision can be made whether to inhibit refresh for that page during the present refresh interval.

Figure 4:
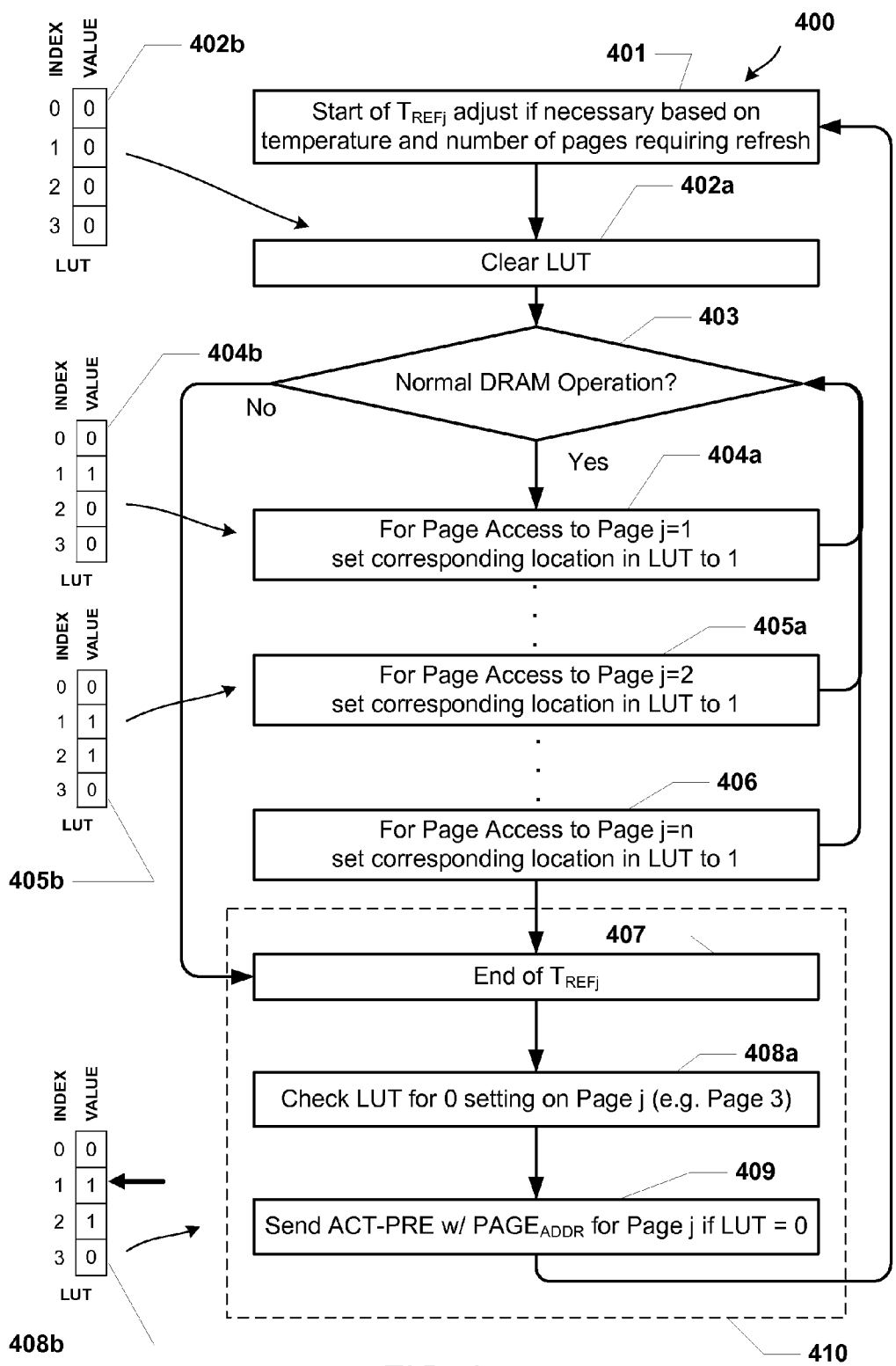
FIG. 4 is a process flow diagram illustrating an aspect method for DRAM page refresh.

In an aspect, method 400 in FIG. 4, illustrating a method of refreshing a memory device, such as a page refresh of a page of memory cells in a dynamic memory device containing one or more pages for example, page refreshes may be controlled based on tracking page accesses. While the method 400 may be illustrative of a refresh procedure for a particular page, the method may be applied for all pages in a similar manner. In block 401, a time for page refresh interval $T_{REFj}$ may be started for a page of index "j" or if looping, the page refresh interval may be reset. The page refresh interval $T_{REFj}$ may also be adjusted if necessary in block 401, taking into account factors such as the temperature and number of pages requiring refresh. Resetting or adjusting the page refresh interval $T_{REFj}$ may be performed in block 401 at startup and at the end of each refresh interval for each page. In block 402a, a first value in a first lookup table, such as a value in a lookup table (LUT-R), may be cleared, such as further shown in connection with a lookup table in block 402b. Clearing the lookup table involves setting or resetting the value to, for example, a zero or other logic value appropriate for the initial logic condition at the beginning of the page refresh interval. In determination block 403, a controller may determine whether the DRAM is operating according to normal operation. In the present disclosure, "normal" operation may refer to operation of the DRAM during the page refresh interval $T_{REFj}$. During the page refresh interval pages may be accessed for read and write as normal, and, for example, when the end of the page refresh interval is reached, the refresh operation may be performed. Individual page refresh interval timers or a main timer reference may be running simultaneously so that aspects associated with refresh for each page may be individually tracked and handled.

When the DRAM is operating according to normal operation (e.g., determination block 403="YES"), for a page access to page PAGEj=1 (e.g. the present index is 1), the corresponding location in the lookup table 404b may be set to 1 in block 404a, indicating that access to the page PAGEj=1 has occurred and refresh is not required. The process may cycle between block 404a and determination block 403 during the page refresh interval for page PAGEj=1. When the DRAM is not operating according to normal operation (e.g., determination block 403="NO"), it may be indicative of the end of the page refresh interval $T_{REFj}$ for page PAGEj=1 in block 407. For other pages, block 401, block 402a, determination block 403 and other blocks may be repeated with an incremented index and processing conducted for individual pages as illustrated in block 405a and 406. For example, when the DRAM is operating according to normal operation for a new page (e.g., determination block 403="YES"), for a page access to page PAGEj=2 (e.g. the present index is now 2), in block 405a, the corresponding location in the lookup table 405b may be set to one, indicating that access to the page PAGEj=2 has occurred and refresh is not required. Determining whether a page access has occurred for a give page may involve, for example, a processor, controller, or other logic in accordance with an instruction or operation of logic setting the appropriate bit in the lookup table to a value of "1" for example upon accessing or in connection with one or a series of other instructions that control the access to the given page or a location within the page.

When the page refresh interval has ended for a page in block 407, the lookup table may be checked to determine if refresh may be required for PAGEj in block 408a. If access to PAGEj has not occurred, the lookup table value will remain zero indicating that a refresh may be required. For example, assuming that the present page index is 3, the lookup table 408b shows that access to PAGEj=3 has not occurred, and thus the page may require a refresh. Accordingly, in block 409, a refresh command sequence comprising an ACT–PRE command pair including the page address for PAGEj=3 may be issued or otherwise generated and sent to the memory. Issuing the ACT–PRE command pair may involve sending signals to a memory controller, or other processor or controller, that is responsible for command processing, or may involve the application of signals associated with the ACT and PRE commands directly to the memory command decoder. The group of procedure blocks including block 407, block 408a and block 409 may comprise refresh processing 410 that occurs every page refresh interval or cycle for each page. During refresh processing 410, the page refresh interval may be reset and restarted or adjusted if necessary in block 401. The entire process starting from block 401, may be repeated for all indexes up to index "n" until all pages have either been accessed or refreshed. The process may cycle continuously thereafter during operation of the device or system.

Figure 5A:
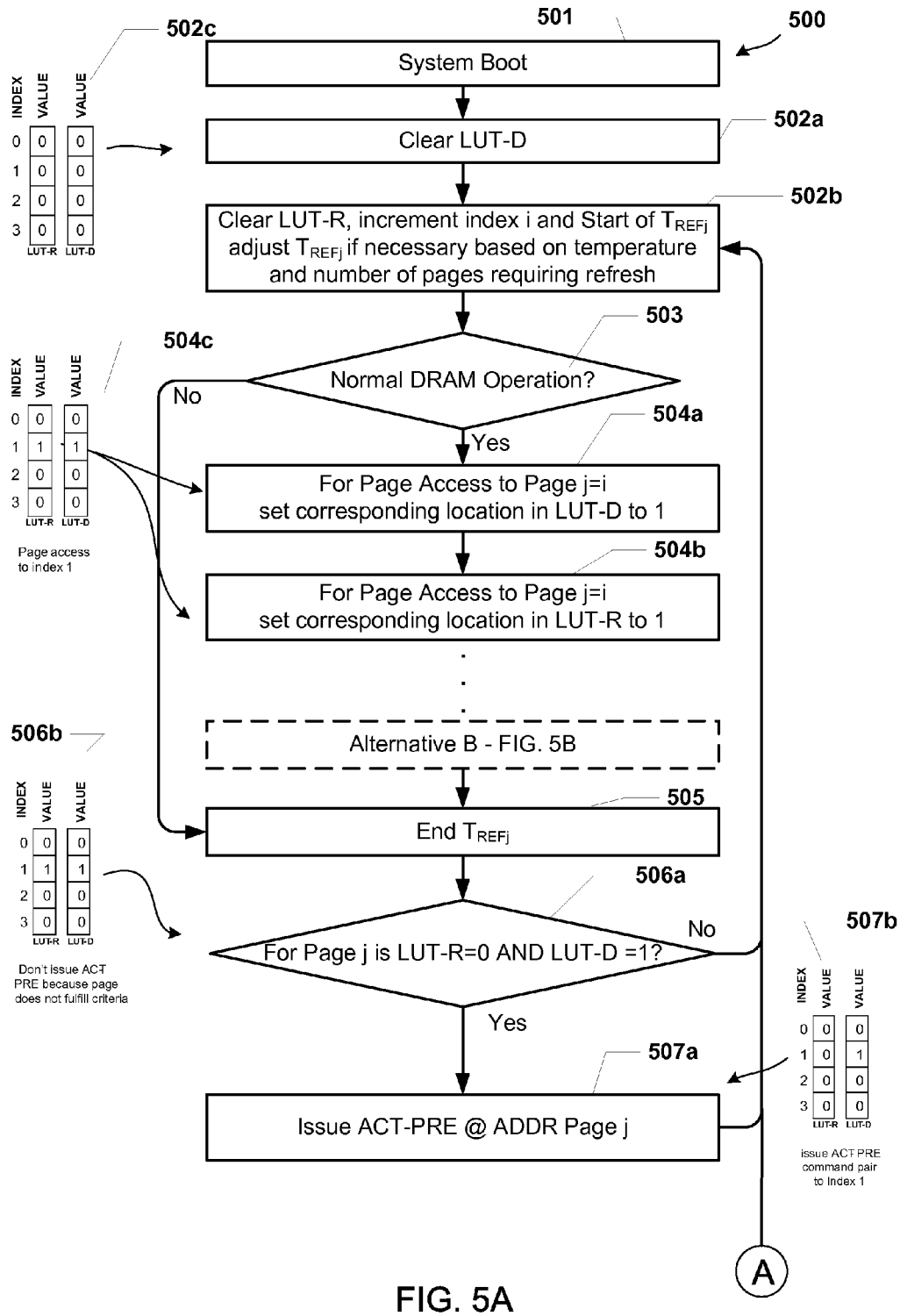
FIG. 5A is a process flow diagram illustrating another aspect method for DRAM page refresh.

An aspect method 500 for providing additional functionality is shown in FIG. 5A. Additional functionality may be provided by way of a two bit per page lookup table containing a first value and a second value for each page in the memory device. In addition to tracking page accesses as described herein above, the present aspect allows an exemplary memory controller, or other control device or logic, to track whether valid data may be present in the relevant memory page. Upon a startup of a system (e.g. initialization or boot), in block 501, the second value in a second lookup table (LUT-D) may be cleared in block 502a. The value in the first lookup table (LUT-R) may also be cleared and an index initialized or incremented and a page refresh interval timer started or reset in block 502b. The page refresh interval $T_{REFj}$ may also be adjusted if necessary in block 502b, taking into account factors such as the temperature and number of pages requiring refresh. An example of the state of the lookup tables in block 502c shows that all values are zero at this stage in processing. In determination block 503 a controller may determine whether the DRAM is operating according to normal operation. When the DRAM is operating according to normal operation (e.g. determination block 503="YES"), for a page access to PAGEj=1 (e.g., the present index is 1) for a write operation, or when a write operation was previously performed and the page has not been cleared, the corresponding location in the second lookup table may be set to a value of 1 in block 504a, indicating that valid data may be present in PAGEj=1. The page access to PAGEj=1 may also cause the corresponding location in first lookup table to be to be set to a value of 1 in block 504b, to indicate that, based on the access, the page does not require a refresh. An example of the state of the lookup tables in block 504c shows that both of the corresponding values for PAGEj=1 are set to a value of 1 indicating that the page has been accessed and contains valid data.

When the DRAM is not operating according to normal operation (e.g. determination block 503="NO"), it may be indicative of the end of the page refresh interval $T_{REFj}$ for page PAGEj=1 in block 505. In determination block 506a, a controller may determine whether for the present page the lookup table values are "0" for the first lookup table and "1" for the second lookup table, indicating that the page requires refresh and contains valid data. When the values for the first and second lookup tables are "0" and "1" respectively (e.g. determination block 506a="YES"), a refresh command consisting of the above described ACT–PRE command pair including the page address for the present page may be issued in block 507 a. An example of the state of the lookup tables in block 507b, shows that the corresponding values for PAGEj=1 are set to "0" and "1" respectively indicating that the present page requires a refresh and contains valid data. When the values for the first and second lookup tables are not "0" and "1" respectively (e.g. determination block 506a="NO"), processing may return to block 502b, in which the first lookup table may be cleared, the page index incremented, set or reset as appropriate, and the page refresh interval timer may be started or reset as appropriate. An example of the state of the lookup tables in block 506b, shows that both values remain set to a value of "1" and therefore the refresh may be required.

For other values of the lookup table bits, different inferences may be made depending on the state of the bit indicating valid data. For example, after initialization such as at the system boot or startup, all lookup table value should be set to a value of "0." However, after operation begins, a "0" value in the second lookup table would indicate that the data for the corresponding page is invalid. A value of "0" in the second lookup table renders any value in the first lookup table logically meaningless, because it is logically inconsistent (e.g. mutually exclusive) for a page to have invalid contents, and to have also been accessed, or to also have not been accessed and to require refresh. A truth table showing the possible conditions in the two bit per page lookup table or tables is shown in Table 1.

TABLE 1

| LUT-R | LUT-D | Description |
|---|---|---|
| 0 | 0 | Upon system boot |
| 0 | 1 | Page contains valid data; was not accessed in the present interval |
| 1 | 0 | Page contains no valid data; was accessed (undefined/invalid) |
| 1 | 1 | Page contains valid data; was accessed |

Therefore, in an aspect, the undefined or "invalid" condition represented by a "0" in the second lookup table renders the value of the first lookup table as a "don't care" value and the condition may be used to represent an alternative or additional meaning and provide additional functionality. The new condition may be shown in Table 2.

TABLE 2

| LUT-R | LUT-D | Description |
|---|---|---|
| 0 | 0 | Upon system boot |
| 0 | 1 | Page contains valid data; was not accessed in the present interval |
| X | 0 | Set LUT-D bit to zero when page contains valid all zero data |
| 1 | 1 | Page contains valid data; was accessed |

Figure 5B:
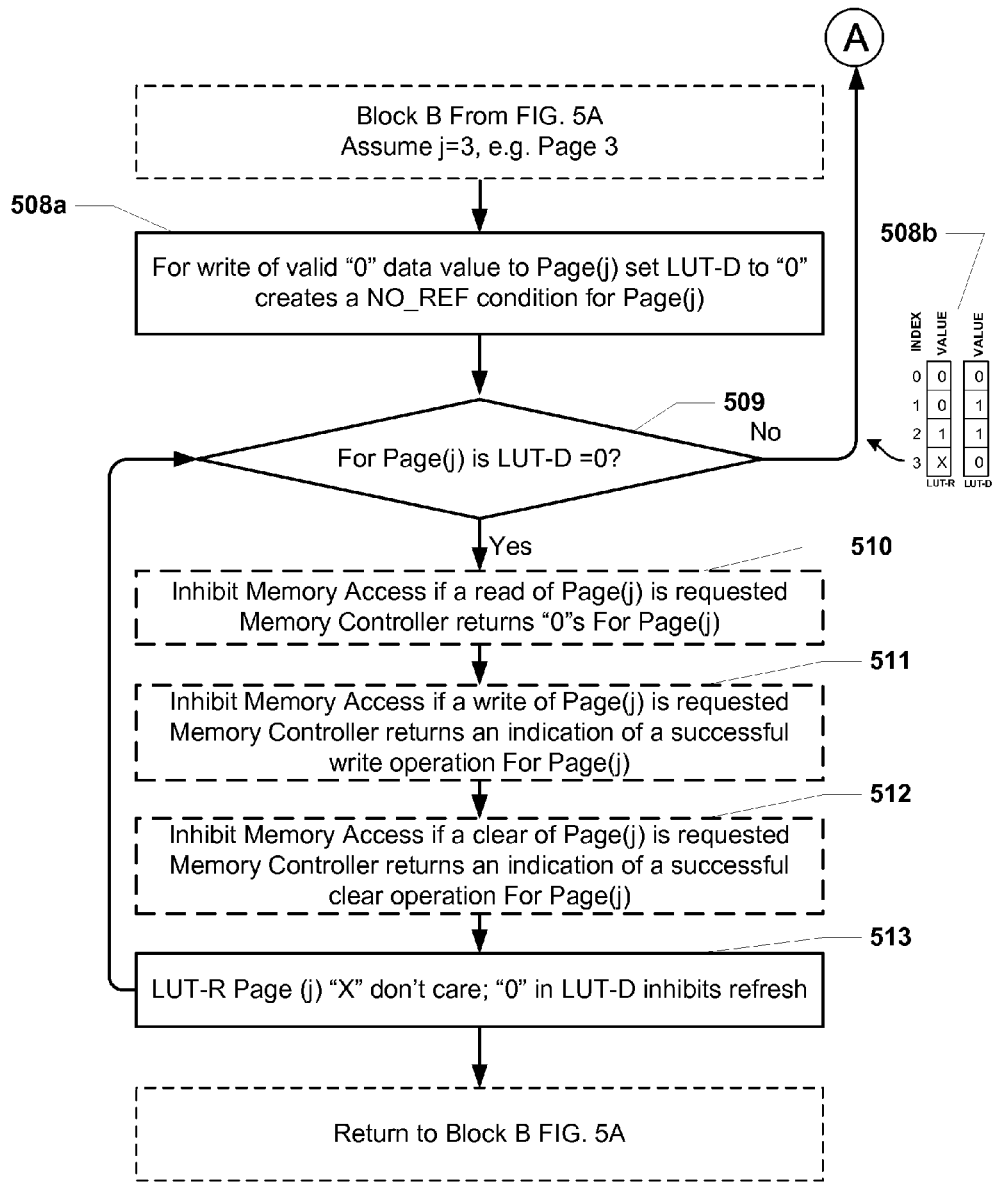
FIG. 5B is a process flow diagram illustrating another aspect method for DRAM page refresh.

In FIG. 5A, during normal DRAM operations (e.g. determination block 503="YES"), additional, optional or alternative processing may be conducted as Alternative B, as shown in FIG. 5B. Assuming a page index of 3, a write of a valid data values of all zeros to PAGEj=3 may result in a value of "0" being written to the second lookup table in block 508a. An example of the state of the lookup tables in block 508b, shows that the "0" value in second lookup table creates a "don't care" condition for the state of the refresh bit in the first lookup table. Accordingly, regardless of whether the page has not been accessed, and would ordinarily require a refresh, when valid data consisting of all zeros is written to the page (e.g. second lookup table value=0) it may be possible inhibit or otherwise bypass the refresh for the page because a zero charge value for the associated page cells may not require a refresh. The all zeros condition may be further advantageously used to inhibit or otherwise bypass direct access to the memory contents.

In determination block 509, for a page PAGEj=3 in which the second lookup table value may be set to "0" (e.g., determination block 509="YES"), read access to the page in the memory device may be inhibited in response to read requests associated with reading any contents in the page, for example by referring to the contents of the lookup table and, in particular, the second lookup table value, or a corresponding single lookup table value. The memory controller or device may instead inhibit the read access by returning, for example to the requesting process, module or device, one or more zeros in response to the read request in block 510 without actually accessing the physical memory device.

Similarly, write access to the memory device may be inhibited in response to a write request associated with writing to cells within the page. The memory controller or device may instead inhibit the write access by returning an indication of a successful write operation, e.g. that the write operation was performed successfully, in block 511. The returned indication may be sent or otherwise communicated, for example to the process, module or device that initiated the write request. Also, writing may be inhibited or avoided when clearing a page of memory, such as during an allocation operation (e.g. C language functions malloc( ), alloc( ), realloc( ), free( ) . . . ). This may be accomplished, for example, by referring to the contents of the lookup table and, in particular, the second lookup table value, or a corresponding single lookup table value. The memory cells need not be specifically written to or cleared for allocation and the clear may be inhibited by returning an indication of a successful clear operation, e.g., that the clear operation was performed, successfully in block 512. The returned indication may be sent or otherwise communicated, for example to the process, module or device that initiated the write request. Setting the second lookup table to "0" may also be used to inhibit a refresh of the page in block 513 because the "all zeros" condition for the page does not require refresh. In an alternative aspect, a single value may be maintained for each page that indicates, for example by a "0" condition, that the page contains all zeros in order to perform the various procedures outlined above without reference to the refresh condition of the page.

Thus, actual access to portions of the memory device may be managed by the state of the "all zeros" bit condition. Such inhibiting or bypassing of memory read and write operations in response to access requests for DRAM pages containing valid data consisting of all zeros, and inhibiting refreshes to such pages may advantageously improve access time, conserve power and prolong battery life.

Figure 6:
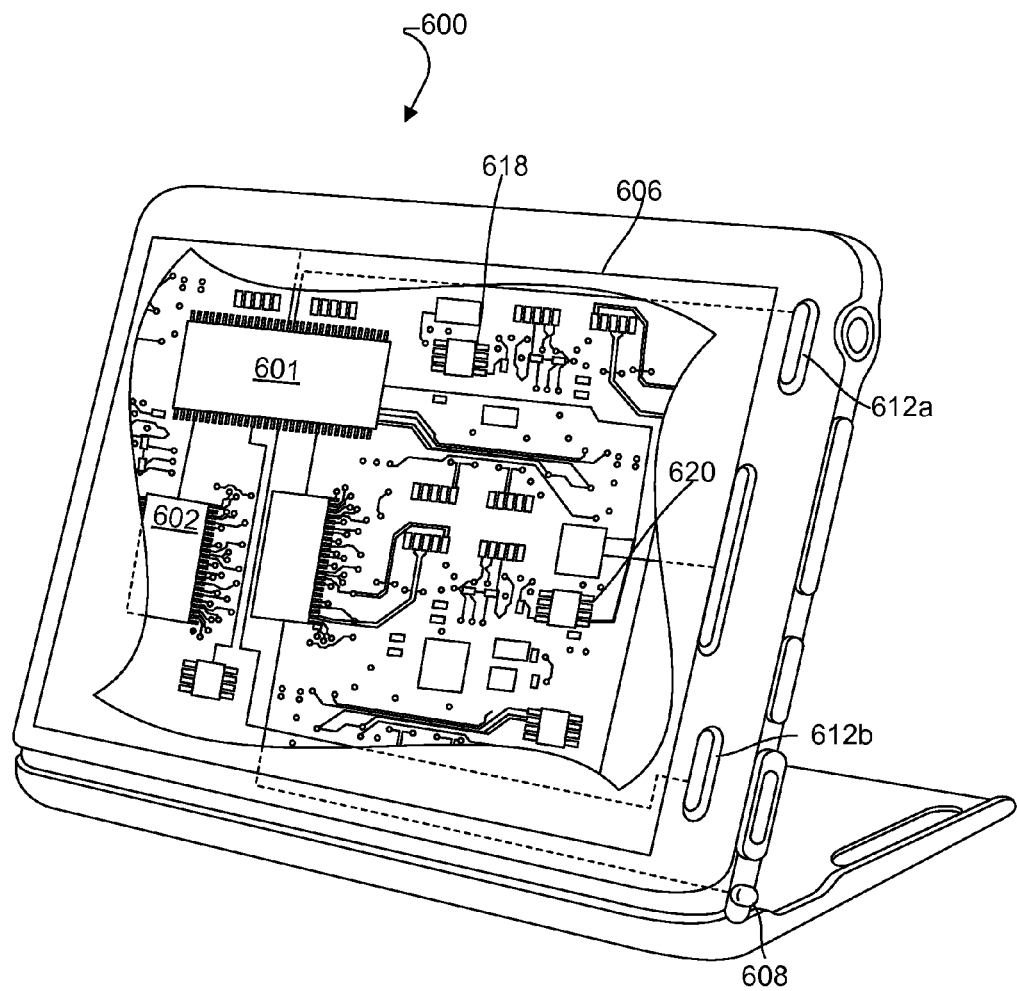
FIG. 6 is a component block diagram of an exemplary mobile device suitable for implementation of various aspects.

The various aspects described herein may be implemented in any of a variety of mobile computing devices (e.g., smartphones, feature phones, etc.), an example of which is illustrated in FIG. 6. For example, the mobile computing device 600 may include a processor 601 coupled to internal memory 602. The internal memory 602 may be volatile or non-volatile memory, and may also be secure and/or encrypted memory, or unsecure and/or unencrypted memory, or any combination thereof. The processor 601 may also be coupled to a touch screen display 606, such as a resistive-sensing touch screen, capacitive-sensing touch screen infrared sensing touch screen, etc. However, the display of the mobile computing device 600 need not have touch screen capability. The mobile computing device 600 may have one or more short-range radio signal transceivers 618 (e.g., Peanut, Bluetooth®, Zigbee®, RF radio) and antenna 608 for sending and receiving wireless signals as described herein. The transceiver 618 and antenna 608 may be used with the above-mentioned circuitry to implement the various wireless transmission protocol stacks/interfaces. The mobile computing device 600 may include a cellular network wireless modem chip 620 that enables communication via a cellular network. The mobile computing device 600 may also include physical buttons 612a and 612b for receiving user inputs.

Figure 7:
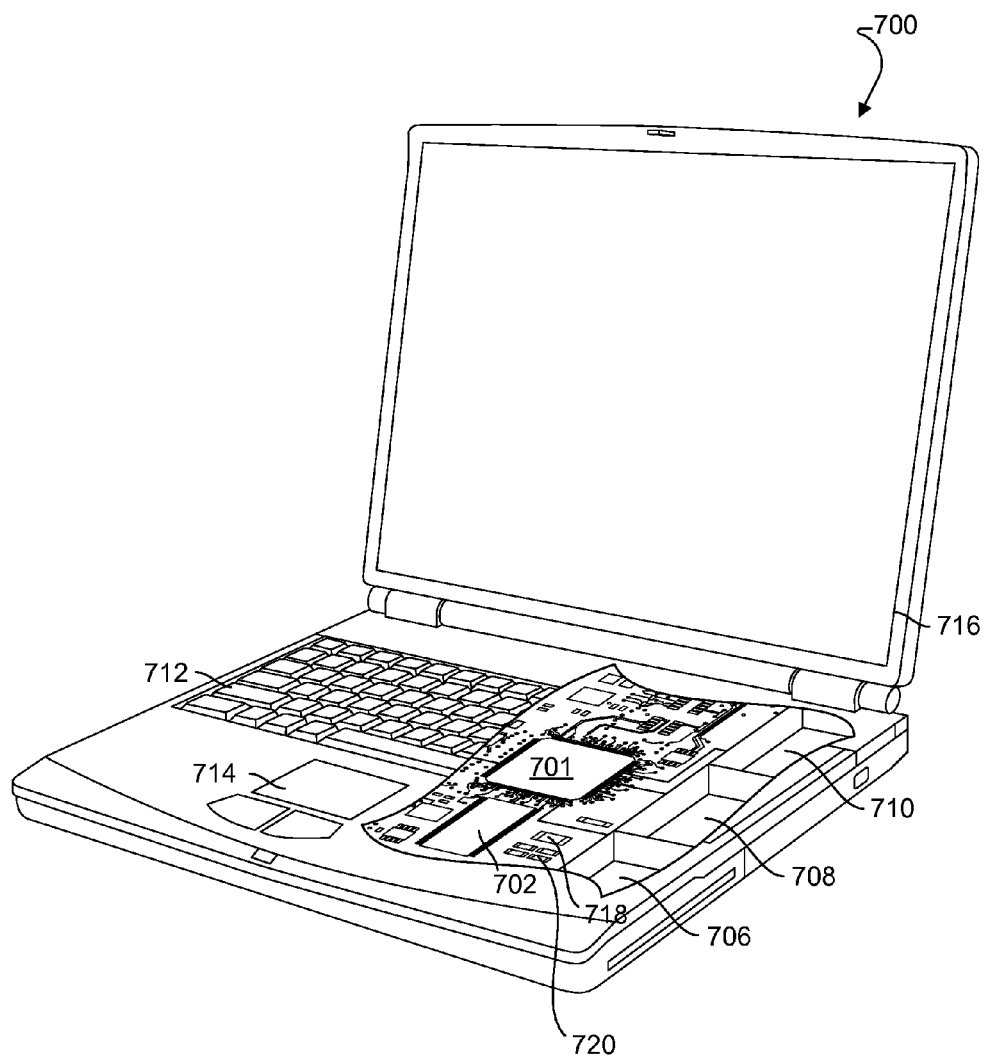
FIG. 7 is a component block diagram of an exemplary mobile computing device suitable for implementation of various aspects.

Other forms of computing devices, including personal computers and laptop computers, may be used to implement the various aspects. Such computing devices typically include the components illustrated in FIG. 7 which illustrates an example laptop computer device 700. Many laptop computers include a touch pad touch surface 714 that serves as the computer's pointing device, and thus may receive drag, scroll, and flick gestures similar to those implemented on mobile computing devices equipped with a touch screen display and described above. Such a laptop computer 700 generally includes a processor 701 coupled to volatile internal memory 702 and a large capacity nonvolatile memory, such as a disk drive 706. The laptop computer 700 may also include a compact disc (CD) and/or DVD drive 708 coupled to the processor 701. The laptop computer device 700 may also include a number of connector ports 710 coupled to the processor 701 for establishing data connections or receiving external memory devices, such as a network connection circuit for coupling the processor 701 to a network. The laptop computer device 700 may have one or more short-range radio signal transceivers 718 (e.g., Peanut®, Bluetooth®, Zigbee®, RF radio) and antennas 720 for sending and receiving wireless signals as described herein. The transceivers 718 and antennas 720 may be used with the above-mentioned circuitry to implement the various wireless transmission protocol stacks/interfaces. In a laptop or notebook configuration, the computer housing includes the touch pad 714, the keyboard 712, and the display 716 all coupled to the processor 701. Other configurations of the computing device may include a computer mouse or trackball coupled to the processor (e.g., via a USB input) as are well known, which may also be used in conjunction with the various aspects.

The processors 601 and 701 may be any programmable microprocessor, microcomputer or multiple processor chip or chips that may be configured by software instructions (applications) to perform a variety of functions, including the functions of the various aspects described above. In the various devices, multiple processors may be provided, such as one processor dedicated to wireless communication functions and one processor dedicated to running other applications. Typically, software applications may be stored in the internal memory 602 and 702 before they are accessed and loaded into the processors 601 and 701. The processors 601 and 701 may include internal memory sufficient to store the application software instructions. In many devices the internal memory may be a volatile or nonvolatile memory, such as flash memory, or a mixture of both. For the purposes of this description, a general reference to memory refers to memory accessible by the processors 601 and 701 including internal memory or removable memory plugged into the various devices and memory within the processors 601 and 701.

While reference is made in the description and in the claims to two lookup tables (i.e., a first lookup table and a second lookup table), such references encompass both two separate lookup tables and a single combined lookup table with two columns or fields. Thus, the first and second lookup tables may be implemented as a single data structure that associates memory page numbers or address ranges with a first value that indicates whether the page includes valid data and a second value that indicates whether the page has been accessed (i.e., by a read or write operation) or otherwise does not require refresh. Thus, references to first and second lookup tables in the claims are not intended to limit the scope of the claims to two separate tables.

The foregoing method descriptions and the process flow diagrams are provided merely as illustrative examples and are not intended to require or imply that the steps of the various aspects must be performed in the order presented. As will be appreciated by one of skill in the art the order of steps in the foregoing aspects may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored on or transmitted over as one or more instructions or code on a computer-readable medium. The operations of a method or algorithm disclosed herein may be embodied in a processor-executable software module which may be stored on a non-transitory computer-readable storage medium. Non-transitory computer-readable storage media may be any available media that may be accessed by a computer. By way of example, and not limitation, such non-transitory computer-readable media may comprise RAM, ROM, EEPROM, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of non-transitory computer-readable media. Additionally, the operations of a method or algorithm may reside as one or any combination or set of codes and/or instructions on a non-transitory machine readable medium and/or computer-readable medium, which may be incorporated into a computer program product.

The preceding description of the disclosed aspects is provided to enable any person skilled in the art to make or use the present invention. Various modifications to these aspects will be readily apparent to those skilled in the art, and the generic principles defined herein may be applied to other aspects without departing from the spirit or scope of the invention. Thus, the present invention is not intended to be limited to the aspects shown herein but is to be accorded the widest scope consistent with the following claims and the principles and novel features disclosed herein.

What is claimed is:

1. A method of refreshing a dynamic memory device, comprising:
   setting, after startup of a system containing the dynamic memory device, a first value in a first lookup table associated with a page of memory cells in the dynamic memory device to indicate when the page of memory cells includes valid data of all zeros; and
   controlling page refreshes performed according to a page refresh interval so as to inhibit refresh of pages of memory cells whose associated first value in the first lookup table indicates that the page of memory cells includes valid data of all zeros.

2. The method of claim 1, further comprising:
   inhibiting access to the page of memory cells associated with a read request when the first value in the first lookup table indicates that the page of memory cells includes valid data of all zeros, and
   returning one or more zeros in response to the read request.

3. The method of claim 1, further comprising:
   inhibiting access to the page of memory cells associated with a write request when the first value in the first lookup table indicates that the page of memory cells includes valid data of all zeros and the write value includes one or more zeros to be written to the page of memory cells, and
   returning an indication of a successful write operation in response to the write request.

4. The method of claim 1, further comprising:
   inhibiting access to the page of memory cells associated with a clear request when the first value in the first lookup table indicates that the page of memory cells includes valid data of all zeros, and
   returning an indication of a successful clear operation in response to the clear request.

5. The method of claim 1, further comprising:
   setting a second value in a second lookup table to indicate that a read or write access has occurred on a corresponding page of memory cells; and
   controlling page refreshes performed according to the page refresh interval so as to inhibit refresh of pages of memory cells whose associated second value in the second lookup table indicates that the read or write access has occurred and whose associated first value in the first lookup table indicates that the page of memory cells includes valid data at least some of which is not zero.

6. The method of claim 5, further comprising:
   clearing the first lookup table at the startup of the system containing the dynamic memory device; and
   clearing the second lookup table and resetting the page refresh interval at an end of the page refresh interval.

7. The method of claim 5, wherein controlling the page refreshes performed according to the page refresh interval comprises issuing an activate (ACT)–precharge (PRE) command pair including a page address for pages of memory cells whose associated first value indicates that valid data that is not all zeros is present in the page of memory cells and whose associated second value indicates that the read or write access has not occurred.

8. The method of claim 5, wherein controlling the page refreshes performed according to the page refresh interval comprises issuing a refresh (REF) command for the dynamic memory device when a number of pages in the dynamic memory device exceeds a threshold.

9. The method of claim 1, wherein the dynamic memory device includes a dynamic random access memory device.

10. The method of claim 1, further comprising:
    determining a number of pages of the dynamic memory device that contain valid data that is not all zeros using values in the first lookup table; and
    adjusting the page refresh interval based on a temperature of the dynamic memory device and the number of pages of the dynamic memory device that contain valid data that is not all zeros.

11. The method of claim 5, further comprising:
    determining a number of pages of the dynamic memory device that contain valid data that is not all zeros using values in the first lookup table;
    determining a number of pages of the dynamic memory device to be refreshed using values in the second lookup table; and
    adjusting the page refresh interval based on a temperature of the dynamic memory device, the number of pages of the dynamic memory device that contain valid data that is not all zeros, and the number of pages of the dynamic memory device to be refreshed.

12. The method of claim 5, further comprising:
    monitoring a command queue associated with the dynamic memory device to determine when an activate (ACT) command associated with the page of memory cells is present in the command queue; and
    controlling page refreshes performed according to the page refresh interval so as to inhibit refresh of pages of memory cells (i) with the activate command present in the command queue (ii) whose associated second value indicates that the read or write access has not occurred on the page of memory cells, and (iii) whose associated first value indicates that the page of memory cells includes valid data at least some of which is not zero.

13. A computing device, comprising:
    a dynamic memory; and
    a processor coupled to the dynamic memory and configured with processor-executable instructions to perform operations comprising:
       setting, after startup of a system containing the dynamic memory, a first value in a first lookup table associated with a page of memory cells in the dynamic memory to indicate when the page of memory cells includes valid data of all zeros; and controlling page refreshes performed according to a page refresh interval so as to inhibit refresh of pages of memory cells whose associated first value in the first lookup table indicates that the page of memory cells includes valid data of all zeros.

14. The computing device of claim 13, wherein the processor is configured with processor-executable instructions to perform operations further comprising:

inhibiting access to the page of memory cells associated with a read request when the first value in the first lookup table indicates that the page of memory cells includes valid data of all zeros, and returning one or more zeros in response to the read request.

15. The computing device of claim 13, wherein the processor is configured with processor-executable instructions to perform operations further comprising:

inhibiting access to the page of memory cells associated with a write request when the first value in the first lookup table indicates that the page of memory cells includes valid data of all zeros and the write value includes one or more zeros to be written to the page of memory cells, and returning an indication of a successful write operation in response to the write request.

16. The computing device of claim 13, wherein the processor is configured with processor-executable instructions to perform operations further comprising:

inhibiting access to the page of memory cells associated with a clear request when the first value in the first lookup table indicates that the page of memory cells includes valid data of all zeros, and returning an indication of a successful clear operation in response to the clear request.

17. The computing device of claim 13, wherein the processor is configured with processor-executable instructions to perform operations further comprising:

setting a second value in a second lookup table to indicate that a read or write access has occurred on a corresponding page of memory cells; and controlling page refreshes performed according to the page refresh interval so as to inhibit refresh of pages of memory cells whose associated second value in the second lookup table indicates that the read or write access has occurred and whose associated first value in the first lookup table indicates that the page of memory cells includes valid data at least some of which is not zero.

18. The computing device of claim 17, wherein the processor is configured with processor-executable instructions to perform operations further comprising:

clearing the first lookup table at the startup of the system containing the dynamic memory; and clearing the second lookup table at an end of the page refresh interval.

19. The computing device of claim 17, wherein the processor is configured with processor-executable instructions to perform operations such that controlling the page refreshes performed according to the page refresh interval comprises issuing an activate (ACT)–precharge (PRE) command pair including a page address for pages of memory cells whose associated first value indicates that valid data that is not all zeros is present in the page of memory cells and whose associated second value indicates that the read or write access has not occurred.

20. The computing device of claim 17, wherein the processor is configured with processor-executable instructions to perform operations such that controlling the page refreshes performed according to the page refresh interval comprises issuing a refresh (REF) command for the dynamic memory when a number of pages in the dynamic memory exceeds a threshold.

21. The computing device of claim 13, wherein the dynamic memory includes a dynamic random access dynamic memory.

22. The computing device of claim 13, wherein the processor is configured with processor-executable instructions to perform operations further comprising:

determining a number of pages of the dynamic memory that contain valid data that is not all zeros using values in the first lookup table; and adjusting the page refresh interval based on a temperature of the dynamic memory and the number of pages of the dynamic memory that contain valid data that is not all zeros.

23. The computing device of claim 17, wherein the processor is configured with processor-executable instructions to perform operations further comprising:

determining a number of pages of the dynamic memory that contain valid data that is not all zeros using values in the first lookup table;

determining a number of pages of the dynamic memory to be refreshed using values in the second lookup table; and adjusting the page refresh interval based on a temperature of the dynamic memory, the number of pages of the dynamic memory that contain valid data that is not all zeros, and the number of pages of the dynamic memory to be refreshed.

24. The computing device of claim 17, wherein the processor is configured with processor-executable instructions to perform operations further comprising:

monitoring a command queue associated with the dynamic memory to determine when an activate (ACT) command associated with the page of memory cells is present in the command queue; and controlling page refreshes performed according to the page refresh interval so as to inhibit refresh of pages of memory cells (i) with the activate command present in the command queue (ii) whose associated second value indicates that the read or write access has not occurred on the page of memory cells, and (iii) whose associated first value indicates that the page of memory cells includes valid data at least some of which is not zero.

25. A computing device, comprising:

means for setting, after startup of a system containing a dynamic memory, a first value in a first lookup table associated with a page of memory cells in the dynamic memory to indicate when the page of memory cells includes valid data of all zeros; and means for controlling page refreshes performed according to a page refresh interval so as to inhibit refresh of pages of memory cells whose associated first value in the first lookup table indicates that the page of memory cells includes valid data of all zeros.

26. The computing device of claim 25, further comprising:

means for inhibiting access to the page of memory cells associated with a read request when the first value in the first lookup table indicates that the page of memory cells includes valid data of all zeros, and means for returning one or more zeros in response to the read request.

27. The computing device of claim 25, further comprising:

means for inhibiting access to the page of memory cells associated with a write request when the first value in the first lookup table indicates that the page of memory cells includes valid data of all zeros and the write value includes one or more zeros to be written to the page of memory cells, and
means for returning an indication of a successful write operation in response to the write request.

28. The computing device of claim 25, further comprising:
means for inhibiting access to the page of memory cells associated with a clear request when the first value in the first lookup table indicates that the page of memory cells includes valid data of all zeros, and
means for returning an indication of a successful clear operation in response to the clear request.

29. The computing device of claim 25, further comprising:
means for setting a second value in a second lookup table to indicate that a read or write access has occurred on a corresponding page of memory cells; and
means for controlling page refreshes performed according to the page refresh interval so as to inhibit refresh of pages of memory cells whose associated second value in the second lookup table indicates that the read or write access has occurred and whose associated first value in the first lookup table indicates that the page of memory cells includes valid data at least some of which is not zero.

30. The computing device of claim 29, further comprising:
means for clearing the first lookup table at the startup of the system containing the dynamic memory; and
means for clearing the second lookup table at an end of the page refresh interval.

31. The computing device of claim 29, wherein means for controlling the page refreshes performed according to the page refresh interval comprises means for issuing an activate (ACT)–precharge (PRE) command pair including a page address for pages of memory cells whose associated first value indicates that valid data that is not all zeros is present in the page of memory cells and whose associated second value indicates that the read or write access has not occurred.

32. The computing device of claim 29, wherein means for controlling the page refreshes performed according to the page refresh interval comprises means for issuing a refresh (REF) command for the dynamic memory when a number of pages in the dynamic memory exceeds a threshold.

33. The computing device of claim 25, wherein the dynamic memory includes a dynamic random access dynamic memory.

34. The computing device of claim 25, further comprising:
means for determining a number of pages of the dynamic memory that contain valid data that is not all zeros using values in the first lookup table; and
means for adjusting the page refresh interval based on a temperature of the dynamic memory and the number of pages of the dynamic memory that contain valid data that is not all zeros.

35. The computing device of claim 29, further comprising:
means for determining a number of pages of the dynamic memory that contain valid data that is not all zeros using values in the first lookup table;
means for determining a number of pages of the dynamic memory to be refreshed using values in the second lookup table; and
means for adjusting the page refresh interval based on a temperature of the dynamic memory, the number of pages of the dynamic memory that contain valid data that is not all zeros, and the number of pages of the dynamic memory to be refreshed.

36. The computing device of claim 29, further comprising:
means for monitoring a command queue associated with the dynamic memory to determine when an activate (ACT) command associated with the page of memory cells is present in the command queue; and
means for controlling page refreshes performed according to the page refresh interval so as to inhibit refresh of pages of memory cells (i) with the activate command present in the command queue (ii) whose associated second value indicates that the read or write access has not occurred on the page of memory cells, and (iii) whose associated first value indicates that the page of memory cells includes valid data at least some of which is not zero.

37. A non-transitory computer readable storage medium having stored thereon processor-executable software instructions configured to cause a processor to perform operations comprising:
setting, after startup of a system containing a dynamic memory device, a first value in a first lookup table associated with a page of memory cells in the dynamic memory device to indicate when the page of memory cells includes valid data of all zeros; and
controlling page refreshes performed according to a page refresh interval so as to inhibit refresh of pages of memory cells whose associated first value in the first lookup table indicates that the page of memory cells includes valid data of all zeros.

38. The non-transitory computer-readable storage medium of claim 37, wherein the stored processor-executable instructions are configured to cause the processor to perform operations further comprising:
inhibiting access to the page of memory cells associated with a read request when the first value in the first lookup table indicates that the page of memory cells includes valid data of all zeros, and
returning one or more zeros in response to the read request.

39. The non-transitory computer-readable storage medium of claim 37, wherein the stored processor-executable instructions are configured to cause the processor to perform operations further comprising:
inhibiting access to the page of memory cells associated with a clear request when the first value in the first lookup table indicates that the page of memory cells includes valid data of all zeros, and
returning an indication of a successful clear operation in response to the clear request.

40. The non-transitory computer-readable storage medium of claim 37, wherein the stored processor-executable instructions are configured to cause the processor to perform operations further comprising:
inhibiting access to the page of memory cells associated with a write request when the first value in the first lookup table indicates that the page of memory cells includes valid data of all zeros and the write value includes one or more zeros to be written to the page of memory cells, and
returning an indication of a successful write operation in response to the write request.

41. The non-transitory computer-readable storage medium of claim 37, wherein the stored processor-executable instructions are configured to cause the processor to perform operations further comprising:
setting a second value in a second lookup table to indicate that a read or write access has occurred on a corresponding page of memory cells; and controlling page refreshes performed according to the page refresh interval so as to inhibit refresh of pages of memory cells whose associated second value in the second lookup table indicates that the read or write access has occurred and whose associated first value in the first lookup table indicates that the page of memory cells includes valid data at least some of which is not zero.

42. The non-transitory computer-readable storage medium of claim 41, wherein the stored processor-executable instructions are configured to cause the processor to perform operations further comprising:
  clearing the first lookup table at the startup of the system containing the dynamic memory device; and
  clearing the second lookup table at an end of the page refresh interval.

43. The non-transitory computer-readable storage medium of claim 41, wherein when the stored processor-executable instructions are configured to cause the processor to perform operations such that controlling the page refreshes performed according to the page refresh interval comprises issuing an activate (ACT)–precharge (PRE) command pair including a page address for pages of memory cells whose associated first value indicates that valid data that is not all zeros is present in the page of memory cells and whose associated second value indicates that the read or write access has not occurred.

44. The non-transitory computer-readable storage medium of claim 41, wherein when the stored processor-executable instructions are configured to cause the processor to perform operations such that controlling the page refreshes performed according to the page refresh interval comprises issuing a refresh (REF) command for the dynamic memory device when a number of pages in the dynamic memory device exceeds a threshold.

45. The non-transitory computer-readable storage medium of claim 37, wherein the dynamic memory device includes a dynamic random access memory device.

46. The non-transitory computer-readable storage medium of claim 37, wherein the stored processor-executable instructions are configured to cause the processor to perform operations further comprising:
  determining a number of pages of the dynamic memory device that contain valid data that is not all zeros using values in the first lookup table; and
  adjusting the page refresh interval based on a temperature of the dynamic memory device and the number of pages of the dynamic memory device that contain valid data that is not all zeros.

47. The non-transitory computer-readable storage medium of claim 41, wherein the stored processor-executable instructions are configured to cause the processor to perform operations further comprising:
  determining a number of pages of the dynamic memory device that contain valid data that is not all zeros using values in the first lookup table;
  determining a number of pages of the dynamic memory device to be refreshed using values in the second lookup table; and
  adjusting the page refresh interval based on a temperature of the dynamic memory device, the number of pages of the dynamic memory device that contain valid data that is not all zeros, and the number of pages of the dynamic memory device to be refreshed.

48. The non-transitory computer-readable storage medium of claim 41, wherein the stored processor-executable instructions are configured to cause the processor to perform operations further comprising:
  monitoring a command queue associated with the dynamic memory device to determine when an activate (ACT) command associated with the page of memory cells is present in the command queue; and
  controlling page refreshes performed according to the page refresh interval so as to inhibit refresh of pages of memory cells (i) with the activate command present in the command queue (ii) whose associated second value indicates that the read or write access has not occurred on the page of memory cells, and (iii) whose associated first value indicates that the page of memory cells includes valid data at least some of which is not zero.

* * * * *